(12) United States Patent
Heath et al.

(10) Patent No.: US 10,108,828 B2
(45) Date of Patent: Oct. 23, 2018

(54) METHOD OF GENERATING CODES FOR ANIMAL MARKING

(71) Applicant: Vium, Inc., San Mateo, CA (US)

(72) Inventors: Kyle Howard Heath, Menlo Park, CA (US); Jonathan Betts-Lacroix, Belmont, CA (US)

(73) Assignee: Vium, Inc., San Mateo, CA (US)

(*) Notice: Subject to any disclaimer, the term of this patent is extended or adjusted under 35 U.S.C. 154(b) by 11 days.

(21) Appl. No.: 15/253,440

(22) Filed: Aug. 31, 2016

(65) Prior Publication Data
US 2018/0060620 A1 Mar. 1, 2018

(51) Int. Cl.
*G06Q 90/00* (2006.01)
*G06K 7/10* (2006.01)
*G06K 7/14* (2006.01)

(52) U.S. Cl.
CPC ....... *G06K 7/10366* (2013.01); *G06K 7/1413* (2013.01)

(58) Field of Classification Search
CPC ........... G06K 19/067; G06K 19/07716; G06K 19/086; G06K 1/121; G06Q 10/087
USPC ................ 235/375–385; 340/573.1
See application file for complete search history.

(56) References Cited

U.S. PATENT DOCUMENTS 7,400,742 B2 * 7/2008 Popp .................. G07C 9/00111
235/375

* cited by examiner

*Primary Examiner* — Jamara Franklin
(74) *Attorney, Agent, or Firm* — Kim Rubin, Patent Agent

(57) ABSTRACT

A method of generating animal identification codes is described. A first and second number are selected, then each number is compared respectively against previously used first and previously used second numbers in a pool. Such comparing uses a computed distance based on how the numbers will be encoded and marked on an animal, such as a Hamming distance of printed symbologies. If the distance computed for either the first or second number is below a distance threshold, that number is discarded and another number is selected. When both numbers pass the distance test, they are added as a pair into the pool. Pairs from the pool may be encoded and marked on an animal. The encoding of the first number may generate a human-readable mark while a different encoding of the second number generates a machine-readable mark.

12 Claims, 7 Drawing Sheets

Fig. 5A
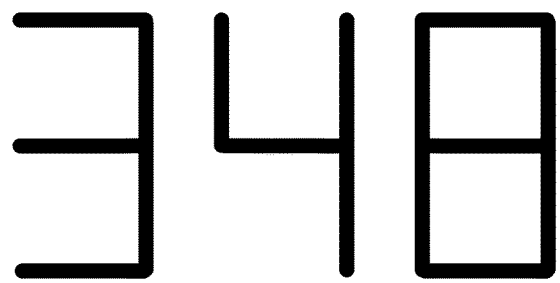
Fig. 5B
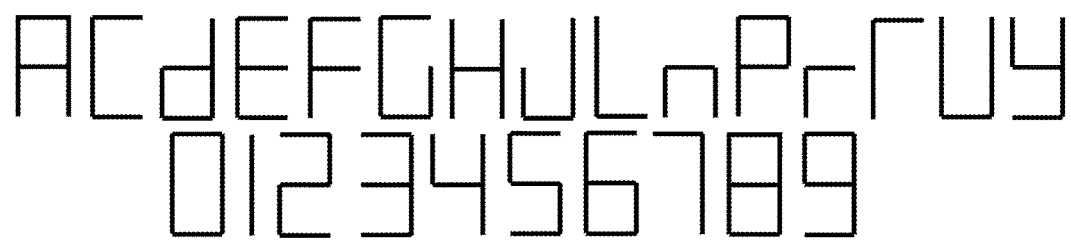
Fig. 5C
B I K M O Q S V W X Z

METHOD OF GENERATING CODES FOR ANIMAL MARKING

FIELD OF THE INVENTION

The invention relates to management of animals in a vivarium for both husbandry and study purposes. More specifically it relates to uniquely identifying animals in the vivarium. Yet more specifically, it is directed to selecting numbers for encoding, for marking both human-readable and machine-readable identification marks on an animal.

BACKGROUND

Vivariums house a number of animals, typically test animals, such as mice, in a number of cages, often a large number. The test animals are frequently used to test drugs, genetics, animal strains, husbandry experiments, methods of treatment, procedures, diagnostics, and the like. We refer to all such uses of a vivarium as a study.

The animals in a vivarium must be observed, either manually by humans or by automated means, such as by the use of video cameras and video analytics software. Comparisons of animals are the basis of any study result.

There are a large number of animal characteristics, attributes, or behavior that may be of interest in a study. We refer to all such observable aspects of animals as "behaviors," including blood, saliva, feces, urine, breath, and fur attributes. Observations of behaviors may be manual or automated and may be invasive or non-invasive. They may occur in the animal's home cage; or in a separate observation or test cage or apparatus; or via pathology or other chemical, biological or analytical analysis. Observations and results may use statistics or aggregated behaviors.

For observing all such behaviors, it is critical that the observed behaviors be reliably, easily, and quickly linked to one particular animal. It is also necessary that marking the animals be consistent, fast, reliable and low cost. Prior art uses a variety of animal identification systems, including one animal per cage, ear notches, ear tags, foot and toe pad tattooing, embedded RFID, attached RFID, body tattoos, and tail tattoos. Some prior art uses human-readable markings, such as ear notches or ID numbers tattooed on a tail. Some prior art uses machine-readable markings, such as RFIDs, ear-tag barcodes, and tail barcodes.

In an ideal world, each animal might receive a globally unique ID that is never re-used. However, that requires a large code space, which in return requires complex markings. Small animal tails are a poor choice substrate for placing readable codes. complex codes either cannot be marked at all, or do not read reliably. In prior art practice, markings are often in a very small code space and other systems are used to uniquely identify an animal. One such prior art method is a marking that is unique only within a single cage. For example, colored ear tags may be used, with only five colors available. Alternatively, ear notches may be used providing a code space size of less than 100. Another prior art method uses unique markings within a single study. Animals in one study are generally kept well apart from animals in another study; thus, unique marking within one study may be sufficient.

All such prior art has significant weaknesses. For machine-readable markings weaknesses include:
risk of confusing one animal with another, for example, if an animal is moved to a wrong cage
not human-readable
slow reading
requires specialized equipment
expensive equipment and expensive to read
computer required to read and map animal ID
may have single-vendor lock-in
two hands often required to use equipment
accuracy and reliability may not be computable or traceable
slow and expensive to mark animals
limited through rate for marking new animals
animals may have to be a minimum age to mark
may work only in-cage or may work only out-of-cage
either applying marks or reading marks may not be sterile
animal may have to anesthetized to be marked.

For human-readable markings weaknesses include:
risk of confusing one animal with another, for example, if an animal is moved to a wrong cage
often not machine-readable
may not be readable in the dark—the animals' natural activity period
reading may be unreliable
typically has a small code space
requires manual data entry to link animal ID to stored data
likely not suitable for machine marking
high labor cost for marking
accuracy and reliability may not be computable or traceable
limited through rate for marking new animals
slow through rate for marking new animals.

Embodiments of this invention overcome many of the weaknesses of prior art.

SUMMARY OF THE INVENTION

In one exemplary embodiment, a human-readable marking comprising three digits is combined with a machine-readable marking comprising a 4×4 vine code with a spine. The two markings are not encoded with the same information. The two markings are then used to index to a unique primary key for each animal in a larger population such as all animals in a vivarium or vivaria.

Markings are selected or assigned using a particular method that minimizes the chances of a read error—either human or machine error—by maximizing the "distance" between used or planned-to-use markings. For example, digits may be comprised of a combination of straight line segments in the well-known "seven-segment" format. A "distance" between two digits is the number of segments that are different between the two digits. This might be viewed as a Hamming distance in a binary, seven-dimensional space. However, some embodiments use a modification or different distance metric or determination method. A distance between two three-digits codes might be the total number of distances between all respective digits.

Distance between two vine code leaves may be the number of leaf segments that are different between the two leaves, where a full-width leaf is viewed as composed of one short-right segment and one short-left segment. A distance between two vine codes might be the total number of differences between all respective leaves.

Some embodiments assign the human-readable marking such that there are no duplicate markings within a segment of the entire animal code space. For example, the human-readable codes may be unique for all animals within one cage or one group of cages, or within one study or sub-study.

An exemplary embodiment of this invention selects a candidate pair of numbers, sometimes randomly, verifies that at least one candidate is not currently in use, then computes a distance between each candidate number in the pair and numbers currently in use. If the new candidates are both sufficiently distant, such as a Hamming distance, from existing numbers in use then this candidate pair is added to a set of number pairs in use. If either number in the pair is to close to an existing number, then either the candidate pair is discarded or the offending number in the pair is discarded and a new candidate pair is chosen. Once a sufficient number of pairs are in the set, then these number pairs may be used to mark animals. When a number pair is marked on an animal, an animal record is created, typically using a primary key, which is unique over all animals in the system.

The steps of selecting numbers, validating them, and using them to mark animals may be overlapped. For example, each candidate number pair, when validated, may be used immediately to mark an animal. Similarly, such number pairs may only be created when needed to mark an animal. An animal record may be created first, then linked with marked number pairs.

Typically, a number pair consists of a number for a human-readable code and a number for a machine-readable code. It is often desirable that within a subset of animals, such as animals in one study, the human-readable markings are all unique. This permits many activities involving the animals in that one study to require reading or recording of only the human-readable marking. Thus, the number for the human-readable marking may be checked for uniqueness or distance separately from the number for the machine-readable marking.

We often refer to the number for the human-readable marking as H; and the number for the machine-readable marking as M. The marking H may be simply digits, such as 348. However, the marking M is typically not commonly humanly readable, such as with a vine code. Thus, although one does not think generally of "encoding" the number 348 into a readable "348" marking, there is in fact a font or rules for such a marking. For example, the digits "348" may be marked using a common "seven-segment" format. Or, an OCR-type font or other font for numbers may be used. Note there is no restriction that the human-readable code be numeric or digits.

A primary advantage selecting numbers that maximize a computed "distance," such as a Hamming distance, is that both human read errors and machine read errors are reduced.

A primary advantage of using both a human-readable marking and a machine readable marking is that the human-readable marking may then be short and easily memorized and recorded without error, within a subset of animals, such as animals in one study. At the same time, the combination of both markings may be used to assure absolute identity and uniqueness of animals in a large population, such as in a vivarium or vivaria. One advantage of a machine-readable marking is higher density recording on a very limited surface area such as a rodent tail. A second advantage is that a human technician will not mistake one (human-readable) marking for another (machine-readable) marking.

We may speak of a distance between two numbers as a shortcut for describing the distance between two encoded markings of the two numbers. That is, the distance may be a distance in the symbol space of the output of an encoding method, rather than a distance between the two pure numbers used as inputs to the encoding method.

BRIEF DESCRIPTION OF THE DRAWINGS

FIG. 5A shows an exemplary human-readable code.
FIG. 5B shows an exemplary human-readable symbol set.
FIG. 5C shows an exemplary set of capital letters missing from a human-readable symbol set.

DETAILED DESCRIPTION OF THE INVENTION

Figure 1:
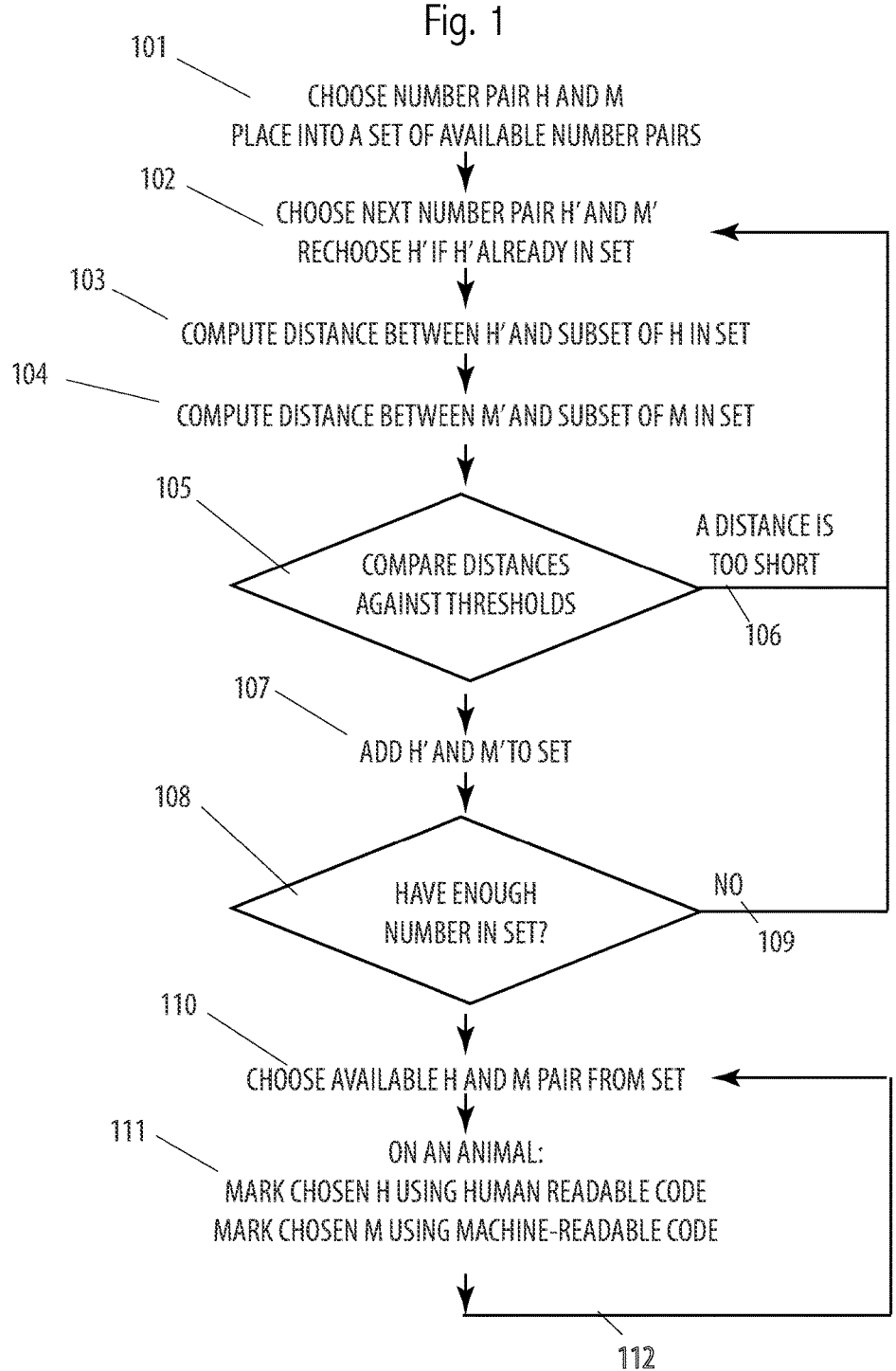
FIG. 1 shows exemplary steps in a method of this invention.

FIG. 1 shows an exemplary embodiment of steps of a method of this invention. Such steps, examples and embodiments are non-limiting.

The word "code" has at least two different meanings. It is necessary to use the context to determine which meaning is appropriate. First, a "code" may be a set of rules that maps an input symbol set to an output symbol set. Common barcodes are such examples. The input symbol set may be decimal numbers, binary numbers, alphanumeric characters and the like. The output symbol set may be groups of lines of varying width, spacing or length. Second, a "code" may refer to one specific marking. That is, one instance of the use of the first definition of "code." This second usage of the word may also use the term "marking." In general, we try to use within the word, "number" for an input and a "marking" for an output.

One exemplary code for human-readable markings is the use of common "seven-segment" decimal digits. Here the input is a decimal number whose length is determined by the number of output characters (digits) are being used. In this context, the code for the human-readable marking may be thought of as a font. One exemplary code for machine-readable markings is a vine code. Vine codes are discussed in more detail below. For a vine code, the input is a number, which may be expressed as either a binary or decimal number.

The word, "symbol" similarly suffers from multiple meanings in the art. For both human-readable and machine-readable codes, generally the output consists of "symbols," such as a single digit or a single leaf in a vine code. However, in the usage of Hamming codes, the word "symbol" has a different meaning. For Hamming codes, each "symbol" is an element, such as a single line segment, that may be in any one of two states, such as marked or not marked. For example, the digit, "3" is a single symbol within a decimal font. However, if marked using a seven-segment format, the "3" comprises seven Hamming symbols, five of which are printed and two of which are not.

Looking at FIG. 1, a first step 101 is to choose a number H and a number M. Such a choice might be random or another method may be used to choose. The range of possible H and the range of possible M depend on the code space used for the human-readable code and the machine-readable code respectively. For example, if three decimal digits are used for the human-readable code, then the range of H is 000 to 999. If a four-leaf vine code is used for the machine-readable code, where each leaf is one of four possible, the code space is 4^4, or 1 to 256 (in decimal notation). It is sometimes convenient to think of such a vine code as coding an 8-bit binary number as its input. This pair of numbers, H and M, are placed into a set of available number pairs.

In step 102 another pair of numbers H' and M' are chosen. Again, these may be chosen randomly or another method may be used. We may think of these as "candidate numbers." We compute the distance between H' and the H numbers in the set of available numbers, in step 103. We also compute the distance between M' and the M numbers in the set of available numbers, in step 104. "Distance" is discussed more, below. For the moment, such distance may the thought of as the Hamming distance of the output symbols of each code as printed. A unique feature of embodiments is the treatment of the H and M separately. For example, in the embodiment shown in this Figure (although not all embodiments) H' is checked to see if it is already in the set in step 102; however, no such check is done for M'. Thus, the human-readable marking is assured uniqueness, which might not be assured for machine-readable marking. Some embodiments also check M' for uniqueness.

In the computing of distances in steps 103 and 104, Hamming distances may be used. However, other methods of computing a readability distance may be used in place. The computation of Hamming distance is highly dependent on the code used. For example, for "seven-segment" decimal digits, there are seven Hamming symbols per printed digit, or 7*3 total Hamming symbols for a three digit marking. For a four-leaf vine code where each leaf consists of a (possibly null) combination of two line segments, the total number of Hamming symbols is 2*4=8.

In some embodiments, H' and M' are compared against all numbers in the set of used numbers. In other embodiments, only a subset of numbers in the set of used numbers are used for the comparison. This may reduce computation time. Such a subset may be chosen randomly or by other means.

In step 105 the results of both computation groups from steps 103 and 104 are compared against a minimum distance threshold. If one or both of H' or M' are too close to an existing number in the set of used numbers, the pair (or only the offending number in the pair) is discarded and a new pair of numbers is chosen by repeating from step 102. Arrow 106 shows this path. Choosing a threshold depends on the codes chosen and the size of the code space and the number of pairs in the set. For the above examples a suitable hamming distance may be 2 to 6 for the three-digit code and 2 to 4 for the 4×4 vine code. Note that a distance of 1 is the minimum possible difference for two marks to be distinct. A Hamming distance of zero means the two marks are the same. Since the codes we use are one-to-one mappings from the input symbol set to the output markings, this means that the input numbers are duplicates, too.

As the size of the set of used numbers increases, it will be harder and harder to choose new H' and M' that are more than a distance of one from all members in the set. Thus, the thresholds used in step 105 may decrease as the size of the set increases. In this way, for application where the number of animals is small, markings that are maximally distinct, and thus have the lowest possible chance of read errors, are used. As the number of animals increases, ultimately the entire code space may be used. In the case of the above example codes, the total code space is 1000×256=256,000.

In step 107, H' and M' candidate numbers have passed the distance threshold stets in step 105 and are added to the set of used numbers.

In step 108, if there are enough numbers in the set the method moves on to step 110, otherwise the process is repeated, 109, going back to step 102.

In step 109 a number pair H and M are chose from the set. These numbers may now be marked on an animal, step 111. The number pair H and M should then be removed from the set of available numbers, or marked as "used" and not selected again in step 110. Once used, they are no longer available, in step 110.

Marking animals repeats, 112, until all desired animals are marked.

Once an animal is marked, a record will generally be created for that animal using a primary key that is unique for all animals over all time in the system. See also FIG. 6. Such an animal record may be created in advance of marking and then updated. Such record creation or updating is not shown in FIG. 1 Also, verification of proper marking may be performed, not shown in FIG. 1.

Note that the steps in FIG. 1 need not be performed in the exact order shown. For example, the steps of selecting and validating candidate H and M, steps 102 through 108, may be overlapped or combined with marking, steps 110 and 111. Numbers may only be selected and validated as needed for marking.

Figure 2:
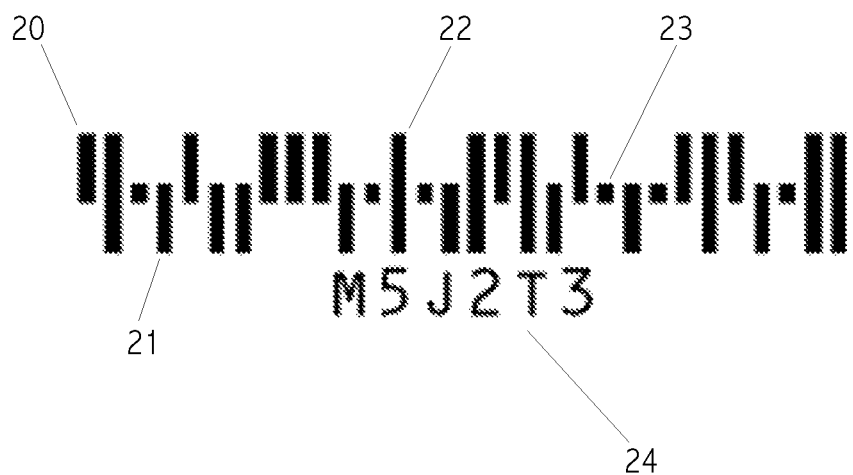
FIG. 2 shows prior art.

FIG. 2 shows prior art vine code. This is an example of one of a number of postal code symbologies. Prior art vine code symbologies do not have a marked spine. Prior art vine code symbologies have no provision for marking a bar as deleted and have no provision for adding a replacement bar for a deleted bar. Prior art vine code symbologies use pre-determined encodings and do not use a dynamic lookup table to map from a printed code to an actual identified, such as a primary key or other animal ID. That is, prior art codes are merely fixed definition fonts, not an index.

Figure 3:
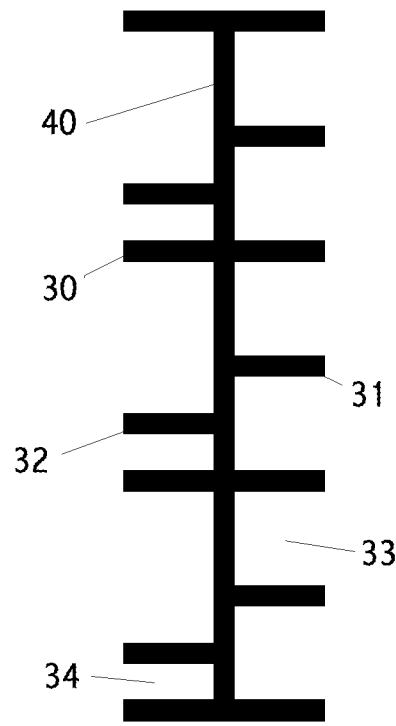
FIG. 3 shows an exemplary vine code with a spine.

Turning now to FIG. 3, we see an exemplary vine code of one embodiment. 30 is a full-width leaf. 31 is a right leaf. 32 is a left leaf. Location 33 shows a null leaf. 34 shows a fixed-width gap between leaves. Null leaves, such as 33, are detected by noticing that the gap between adjacent leaves is twice the fixed-width gap 34 plus the thickness of one line segment. Note that the prior art code in FIG. 2 does not have null leaves.

In some embodiments, each leaf of the vine code may encode two bits each. In some embodiments, two bits may be encoded as one of: (i) a right leaf 31; (ii) a left leaf 32; (iii) a full-width leaf 30; and (iv) a null leaf 33. In some embodiments a leaf that is longer than a full-width leaf may be used to indicate a deleted leaf position or a marking error. In this Figure, line width is not part of the coding. In this Figure, the spacing 34 between leaves is fixed: line width is not part of the coding. An advantage over prior art is that by ignoring both line width and line spacing in the coding, the significant real-time and growth-based dynamics of a rodent tail do not distort the marked code so as to reduce the reliability of reads or cause misreads. Even if any such misread rate is low, the misread rate not accurately computable. In addition, both line thickness and line spacing are difficult to control when tattooing, whether the tattooing is done manually or by a robot.

An exemplary vine code, such as shown in FIG. 3, may encode 8-14 bits, 12-16 bits, 14-18 bits, 16-20 bits, 18-22 bits, 20-24 bits, or 22-28 bits, 14-20 bits, or 8-28 bits. The vine code may or may not comprise check bits, parity bits, checksums, CRC, and forward error correction. Specific vine codes to mark may be selected such that a Hamming distance, where the "Hamming symbols" are each short line segment in a leaf, is maximized amongst all used codes, or amongst a subset of used codes. All leaves in the shown code have two short line segments. A full width leaf has two marked short line segment regions. A null leaf has two unmarked short line segments. Left and right leaves have one marked and one unmarked short line segment.

Figure 4:
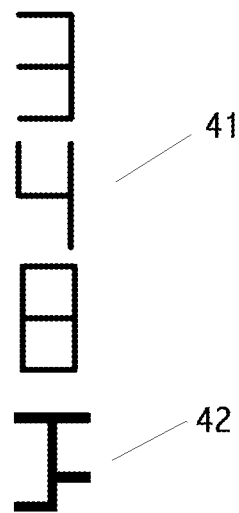
FIG. 4 shows combined machine-readable and human-readable code combination.

Turing now to FIG. 4, we see an exemplary combination of both a human-readable code portion 41 and a machine-readable code portion 42. Here the human-readable printed code is for then umber 348. The characters are printed nominally in the common, "seven-segment" format. However, other fonts or character formats may be used. the machine-readable portion is a four-leave vine code where each leaf is one of four possible leaf symbols. This code marking has a spine, which is vertical in the Figure. The top-most leaf is full-width. The second leaf is null. The third leave is right. The fourth leaf is left. Thus, 42 in this Figure shows all four leaf symbols. This code encodes 2*4=8 bits, or 256 possible input values. The three digit numeric code codes 1000 possible input values, from 0 to 999. Thus, the combination of the human-readable code and the machine-readable code encodes 256*1000=256,000 possible input values.

Turning now to FIGS. 5A and 5B, we see an exemplary symbology for the characters in a human-readable code. All characters may be formed by a non-empty subset of seven straight-line segments, arranged in a well-known "seven-segment" formation. The use of this formation is uniquely advantageous for tattooing rodent tails because each line segment may be formed by motion in only one axis. The motion may be manual or automated. Either the rodent (or the platform on which the rodent rests) may be moved, or the tattooing apparatus may be moved. In one embodiment, motion along the axis of the tail is implemented by supporting a tattooing head on a linear track, which in turn may be supported by a gantry or other support structure. In one embodiment, the other axis may be implemented by rotating the tail around the tail axis. For manual tattooing, such rotation may be via one or more finger(s) gently placed on the tail. For automatic tattooing, a motorized rubber finger or fingers may be used, effectively operating similar to manual operation. Tattooing movement in only one axis at a time is far easier for human operators, which is a unique problem, and for which this code symbology is a novel solution. See also FIG. 8.

FIG. 5A shows an exemplary coded mark, here the three characters "348," using the exemplary symbol set shown in FIG. 5B. Note that all symbols shown in FIG. 5B may be formed from a subset of the seven-segment line segments. Note that all symbols shown in FIG. 5B are readily identifiable without confusion with other symbols, and also readily memorized in codes. The marking shown in FIG. 5A may also use only decimal digits as its input set.

The symbol set for the human-readable code may comprise an alphanumeric character set comprising digits and Roman letters such as shown in FIG. 5B. The human-readable code may comprise only digits, as shown in FIG. 5A. The human-readable code may comprise an alphanumeric character set comprising digits and limited Roman letters such that the remaining Roman letters in the character set are easily recognizable and clearly distinguishable from digits or other Roman characters. The human-readable code portion may be one character, two characters, three characters, four characters, or five characters, or the range of 1-2, 1-3, 1-4, 2-3, 2-4, or 3-4 characters. One such reduced character set is shown in FIG. 5B. Here, the letters "D" and "N" are represented more closely to their traditional lower case appearance: "d" and "n" respectively. The letters T and Y appear asymmetric in the code; however, they are still easily identifiable by people. Within the context of our claims, we explicitly claim all similar reduced character sets, similarly reduced for readability in a seven-segment format, under the Rule of Equivalents.

FIG. 5C shows Roman characters not used in the exemplary symbol set due to their similarity to other digits or characters.

Another embodiment uses the seven line-segment basis expanded to nine segments by the addition of two, three, or four diagonal segments in the upper and lower rectangles formed within the digit "8." The addition of these diagonal segments permits the full 36-character alphanumeric character set to be distinctly marked.

Numeric only and alpha only symbol sets are expressly claimed as alternative embodiments to an alphanumeric symbols set.

Figure 6:
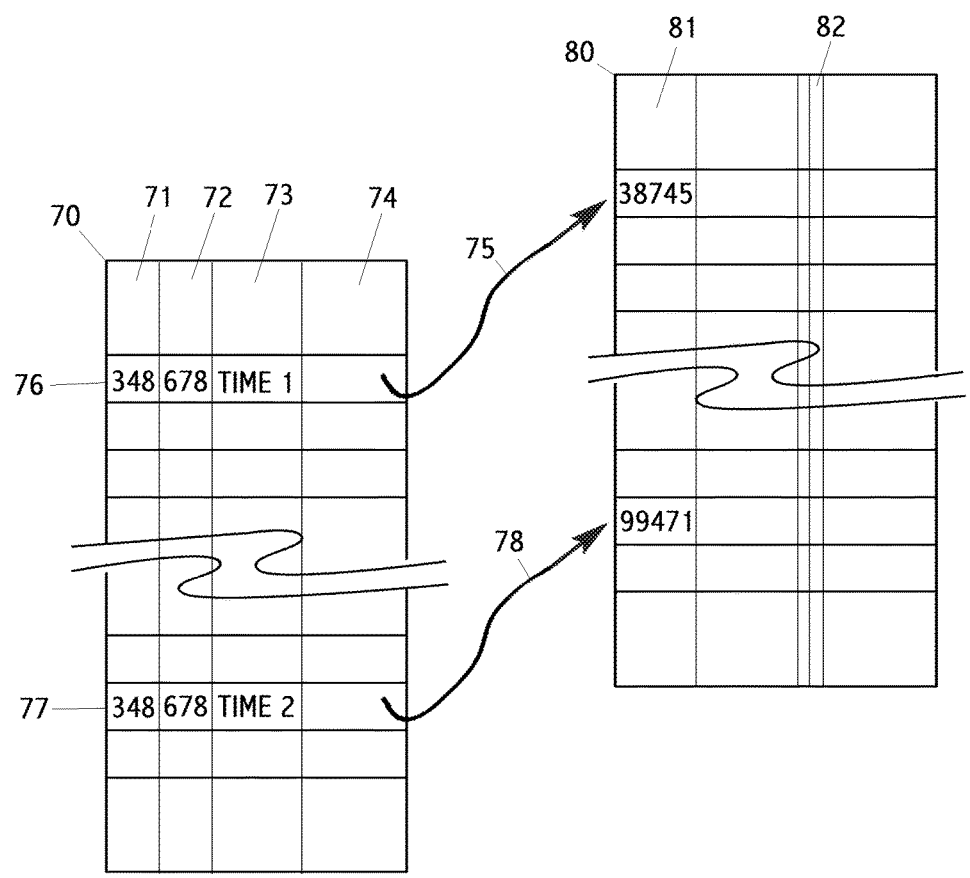
FIG. 6 shows a first mapping table that uses both the numbers for the human-readable marking and the machine-readable marking to index into a primary key table.

Turning now to FIG. 6, we see exemplary elements of important embodiments. Table 70 is a "marking table" that may be used to look up a given marking on an animal. Column 71 contains values of a human-readable code mark. Column 72 contains values of a machine-readable code mark. Column 73 contains a time window. Column 74 contains a link to a primary key, or a value of a primary key. If a particular human-readable code value, machine-readable code value, and time is in the table, such as shown in row 76 and 77, then the link in column 74 will point to a valid primary key. If a particular human-readable code value, machine-readable code value, and time is not in the table, there may be no matching table row, the field in column 74 may be null, or there is indeed an entry for a primary key but the record, in table 80, shows that the primary key is not valid for this read context. Note that typically a lookup in table 70 has a "read time" associated with it. For the lookup to have a valid row in the table, the read time must be within the time window in the field in column 73. Roughly, each valid row in table 70, such as rows 76 and 77 corresponds to one animal. Note that the same human-readable code and same machine readable code may be marked on two different animals, at different times. For example, rows 76 and 77 show this. The time window values TIME 1 and TIME 2 do not overlap. Thus, for any given read time, at most only one of these two read rows will be valid. Typically, time windows are associated with a lifetime of an animal.

Table 80 is the primary key table. Column 81 holds the field for the primary key. The primary key is unique for all animals participating in this system. For example, it may be unique for all animals ever in a vivarium or in a group of vivaria. 82 shows schematically other fields in each record. Typically, there may be 30 to 50 fields, comprising information such as species, source, birthdate, cage number, one or more studies, treatments, outcomes, death date, links to other information, and much more information about a single animal per primary key. Table 80 shows primary keys for two animals, 38745 and 99471. These animals would not be alive at the same time because we see from rows 76 and 77 in table 70 that they have the same code markings.

Note that FIG. 6 is illustrative only, showing tables 70 and 80 as flat tables. In practice, many other implementations are possible, such as the use of relational databases, objects, dictionaries, arrays, other table types, and the like. Arrows 75 and 78 show the relationship between the records 76 and 77 in table 70 and the records associated with primary keys 38745 and 99471 in table 80, respectively.

Figure 7:
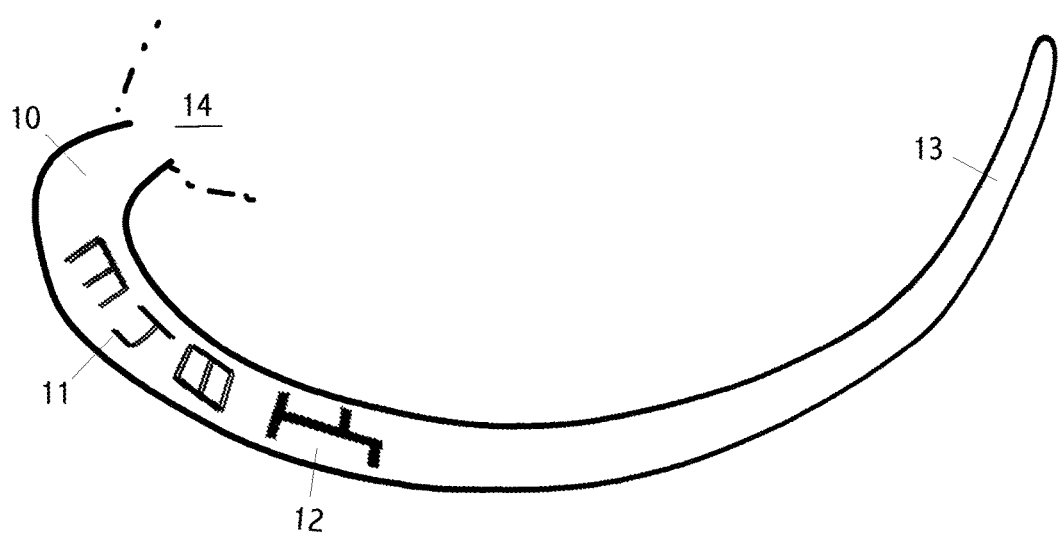
FIG. 7 shows a rodent tail with a combined code tattooed.

FIG. 7 shows an exemplary human-readable code portion 11 and an exemplary machine-readable code portion 12 on a rodent tail 13. 10 is the body end of the tail; 13 is the tip end of the tail. 14 shows a partial rodent body In some embodiments the human-readable code portion is also machine-readable.

In some embodiments, the human-readable code portion is unique within one current study, however, such a limitation is not a requirement for all embodiments.

In some embodiments, the machine-readable code portion is unique for all animals in a vivarium, or for all currently live animals in a vivarium. In some embodiments, the combination of the human-readable code portion and the machine-readable code portion is unique for all animals in a vivarium, or for all currently live animals in a vivarium. For example, the machine-readable code portion may map to a study ID.

In some embodiments an animal code, the data marked on the animal, is mapped via a mapping table to the animal ID. Such a mapping table is shown in FIG. 6. This may be true for just the human-readable portion, or just the machine-readable portion, or both. One advantage of this is that animal codes may be reused, while keeping the animal IDs unique, at least within a known scope, context, and time period. For such embodiments, the animal code may be called or thought of as a "token." The animal code, or token, is then used as (or is) an index into one or more mapping tables. One such map type is a "through map" meaning that some or all of the table lines comprise data that is the same as the index for that line. In these cases the code is then the same as the corresponding ID.

Continuing with FIG. 7, we see both a human-readable code portion 11 and a machine-readable code portion 12 marked on a rodent tail. 13 The rodent may be a mouse. The method of marking may be tattooing. The human-readable code 11 may comprise an alphanumeric character set comprising digits and Roman letters. The human-readable code may comprise digits, as shown 11 in this Figure. The human-readable code 11 may comprise an alphanumeric character set comprising digits and limited Roman letters such that the remaining Roman letters in the character set are easily recognizable and clearly distinguishable from digits or other Roman characters. The human-readable code portion may be one character, two characters, three characters, four characters, or five characters, or the range of 1-2, 1-3, 1-4, 2-3, 2-4, or 3-4 characters.

Some embodiments use symbol sets that are numeric only or alpha only. Symbol sets may comprise or consist of foreign (non English) alphabet symbols. Such symbol sets are expressly claimed. Numbers instead of alphanumeric human-readable symbol sets do not code as efficiently with respect to animal tail area, and thus are not preferred. Also, they may be more difficult of humans to read and memorize accurately. (Compare, for example, quickly memorizing five digits compared to three letters.)

The human-readable code portion 11 may code an animal ID, unique within a known scope. The human-readable code portion 11 may code an animal ID, unique within one animal study. The human-readable code portion 11 may be a first animal code, where the first animal code must be looked up in a first animal code-mapping table whose entries comprise the corresponding animal ID.

Continuing with FIG. 7, the machine-readable code portion 12 may be a vine code, with or without a spine. It may be a barcode known in the art. The spine is aligned with the tail such that the code is easy to read with machine vision, as the spine clearly demarks the location and curvature of the tail, and also provides a reference point for determining if the bars, (or "leaves") in the code are ascenders, descenders, full-height or missing. A rodent tail may not only curve dynamically with rodent activity, but also rotate around the tail axis. The tail may also curve upward. Thus, a code spine is valuable to determine all such distortions from an ideal, flat, rectangular, fixed substrate for the code marking. In addition, the tail may be partially covered with detritus, such as bedding or other material. A continuous spine makes if far easier to determine reliably if a portion of the machine-readable code is so obscured.

Prior art required white or black cage bottoms to machine-read a tail barcode. Prior art required cages to be free for bedding, as that might obscure a portion of the code, causing a misread. Use of a vine code with a spine eliminates these requirements as the dark markings on a light tail provide sufficient contrast, and use of a spine does not require that the edges of the tail be identifiable.

In some embodiments the machine-readable code portion 12 is an animal identifier within a known scope. In some embodiments the scope is all the animals in a vivarium. In some embodiments the scope is all the live animals in a vivarium. In some embodiments the scope is all the animals in a group of vivariums.

The machine-readable code portion 12 may be a second animal code, where the second animal code must be looked up in a second animal code-mapping table whose entries comprise the corresponding animal ID. The machine-readable code may be a second animal code, where the second animal code must be looked up in a second animal code-mapping table whose entries comprise a corresponding study ID.

In some embodiments the combination of the human-readable and the machine-readable code portions is an animal identifier within a known scope. In some embodiments this scope is all the animals in a vivarium. In some embodiments the scope is all the live animals in a vivarium. In some embodiments the scope is all the animals in a group of vivariums. In some embodiments the scope is all the live animals of all vivariums. In some embodiments the scope is all the animals of all vivariums.

The combination of the human-readable and the machine-readable code portions may be a third animal code, where the third animal code must be looked up in a third animal code mapping table whose entries comprise the corresponding animal ID.

The code space of the machine-readable code portion may be no more than 10,000; 100,000; 1,000,000; 10,000,000; or 100,000,000. The code space of the machine-readable code portion may be no more than 12 bits, 14 bits, 16 bits, 18 bits, 20 bits, 22 bits 24 bits, 26 bits, or 28 bits. The code space of the machine-readable code portion may in the range of 12-14 bits, 12-16 bits, 14-18 bits, 16-20 bits, 18-22 bits, 20-24 bits, or 22-28 bits, 14-20 bits, or 16-28 bits. The machine-readable code portion may or may not comprise check bits, parity bits, checksums, CRC, and forward error correction.

The animal in FIG. 7 which both a human-readable marking and a machine-readable marking have been placed may have no additional placed markings. Indeed, the ability to identify animal with no additional markings are the benefits of key embodiments.

Figure 8:
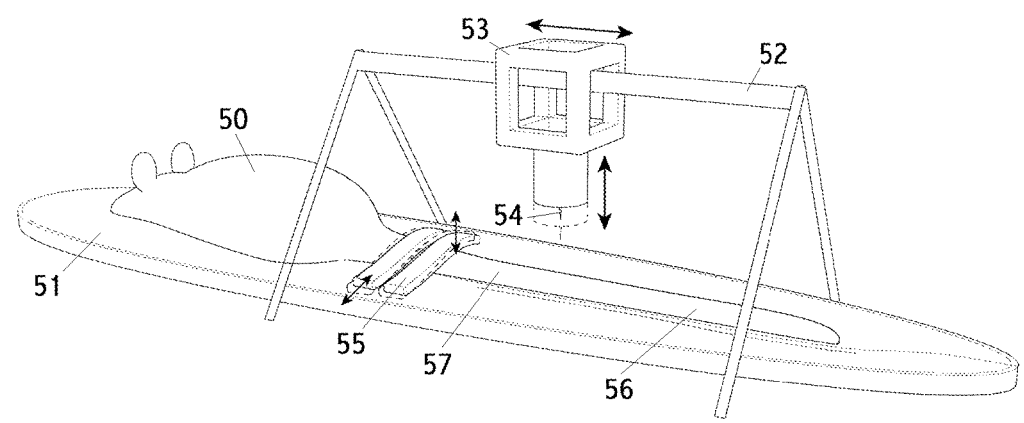
FIG. 8 shows an automated or manual device for tattooing rodent tails.

FIG. 8 shows an automated or manual marking machine. Here, 50 is a mouse on a work surface 51. Rollers 55 are used to roll the tail back and forth. Such motion may be used to mark line segments perpendicular to the tail, 57. 56 and 57 show the mouse tail. 56 is nearer the tip of the tail; this region is not suitable for marking. 57 shows a tail portion closer to the body of the mouse; this region is suitable for marking. A marking head, such as a tattooing head is shown as 53. The head is supported on a frame, 52. The head is capable of two directions of motion as shown by the arrows: axially along the tail and vertically to raise or lower a tattoo tip, 54.

Human-readable codes may also be machine-readable.

In most cases, there is nothing to prevent a person from reading a machine-readable code.

The head 53 and the tail rollers may be operated manually or may be automated. Many different configurations of manual and automated marking devices are possible. For manual operation, the rollers 55 may be replaced by fingers and the head 53 may be a hand-held tattooing head. As shown schematically, such a machine is capable of marking both human-readable and machine-readable codes. FIG. 1 shows an exemplary result of marking a rodent tail.

Both control of the operation of the machine of FIG. 8 and the verification of correctly marked codes may be performed by the use of a single video camera, not shown in this Figure. Such use of a single camera for both purposes is an embodiment.

An alternative embodiment to traditionally tattooing is to damage, abrade or puncture the skin on the rodent tail either before after applying ink. Such action may be caused by an automatically controlee needle or knife, or a laser. In one embodiment the ink is applied manually, in bulk, either before or after damaging, abrading or puncturing the skin in the pattern to be marked on the tail.

An alternative embodiment to traditionally tattooing is using an ink jet printer print head to apply ink. The skin of the rodent tail may be damaged, abraded or punctured prior to applying the ink via the print head. One advantage of using an ink jet print head is the ability to easily use colored ink. Such an embodiment is specifically claimed. In one embodiment this color is used to identify a mouse within the scope of one cage. The color may be part of one of the code portions described herein, or may be an additional marking.

An embodiment comprises reading codes as described herein, including devices of reading and methods of reading. Embodiments include systems that use both reading and writing, which might be use, for example, as a comprehensive animal identification system in a vivarium.

The human-readable code and its associated symbology, features and data table are claimed as embodiments independent of the machine-readable code.

The machine-readable code and its associated symbology, features and data table are claimed as embodiments independent of the human-readable code.

An embodiment comprises reading codes as described herein, including devices of reading and methods of reading. Embodiments include systems that use both reading and writing, which might be use, for example, as a comprehensive animal identification system in a vivarium.

A reading embodiment includes one that tracks the drift of the appearance of a marked code over time. Such changes include: stretching either lengthwise or width as the animal tail grows; distortion, such as adding curvature as the animal tail grows, ages, or distorts; change in color or contrast of the marking or the tail skin over time; blurring of lines over time; missing sections of line segments due to injury, shedding, cleaning and the like. On one embodiment such changes are tracked via one or metrics built into the "native" reading of a code. One such metric is the non-uniform stretch of bar spacing. For example, a tail does not grow uniformly. Thus, one end of a bar code may stretch more than the other end. Therefore, it is desirable to track such non-uniform stretching as the rodent grows and use that tracked metric (which may be averaged, or predicted) as a baseline of expected positions of symbol elements. Another example is the aspect ratio of either alphanumeric symbols or vine code symbols changing over time. Therefore, it is desirable to track such aspect ratio changes as the rodent grows and use that tracked metric (which may be averaged, or predicted) as a baseline of expected shapes of symbol elements. Such tracking and use of time-evolving metrics, tracked per animal, is expressly claimed.

Another aspect of change to animal markings consists of less-structured changes. For example, an injury or detritus may add a dark or light area to section of a marked code or the background tail skin. A recorded image of the rodent tail, including the section with the marked code, may then be used as a baseline for code recognition. For example, a permanent piece of detritus, or an injury, might obscure a section of code. Although that code section is no longer readable using the native code reading algorithm, by use of a recorded image of that animal tail, plus reading the remaining portions of the code, the animal can be uniquely and reliably identified. Thus, in this aspect, images of animal markings are recorded and tracked as they change over time, and these images (which may averaged) are used as part of animal code reading and animal ID determination. This aspect and these reading steps are expressly claimed as embodiments for both devices and methods.

ADDITIONAL EMBODIMENTS

Embodiments of this invention explicitly include all combinations and sub-combinations of all features, elements and limitation of all claims. Embodiments of this invention explicitly include all combinations and sub-combinations of all features, elements, examples, embodiments, tables, values, ranges, and drawings in the specification and drawings. Embodiments of this invention explicitly include devices and systems to implement any combination of all methods described in the claims, specification and drawings.

Embodiments specifically include all independent claim limitations in all combinations with all independent claims.

Embodiments are claimed wherein the word "comprises" is replaced with the word, "consists," in one or more places in a claim.

DEFINITIONS

Code—The term, "code" has three different meanings depending on context. (i) It may be a method, algorithm, set of rules, or a standard of creating a mark or marking from an input, such as number or alphanumerics. For this meaning the word or process, "encoding" may be used, instead. (i) It may refer to the mark or marking itself. (iii) It may refer to entire process that comprises the first method, (i), as only a part of that process. For meanings (i) and (iii), one may consider that the encoding has an "input" and an "output." Nearly all encodings have a reverse "decoding." The input to an encoding may have a well-defined input symbol sets. The output of an encoding will have a well-defined output symbol set. An encoding may be the use of a font.

Combination—any combination of members of a set, including a null set and all members of a set, unless otherwise stated or obvious. The elements of the combination may be ordered or unordered. The elements may have fixed positions, or may have variable positions, or may have no positions.

Distance—The distance between two elements may be viewed generally as a Hamming distance, although different embodiments may compute distance differently, including modifications to a traditional Hamming distance. See www- .wikipedia.org for industry technical description of Hamming codes. For embodiments herein, for numeric characters based on a "seven-segment" layout, each "hamming symbol" is one of the seven segments. The Hamming space may then be viewed as a binary 7-dimensional space. For leaves in a vine code where each leaf has four possible states (e.g. length) the Hamming space is a binary space with 4 dimensions. A distance for two specific single symbols in a symbol set generally sums the Hamming distance for all pairs of elements (where these elements are the "Hamming symbols") of the two symbols. A distance for a first group of symbols and a second group of symbols generally sums the Hamming distance for all respective pairs of symbols in the two groups. However, minimums or maximum distance may be used for selection. Note it is important to distinguish "Hamming symbols" from symbols marked as outputs from codes, such as one full decimal digit or one full leaf in a vine code. As a shortcut of referring to the Hamming distance (or other distance calculation) of output symbols from an encoding we may refer only to the distance of two input symbols or input values.

Distinct—two or more elements are distinct if they are not the same, or not effectively the same in the described context. For example, two numbers are distinct if they are not the same number. Two or more elements may be non-tangible or abstract elements, such as the set of numeric characters and the set of alphanumeric characters, or calculus and algebra. As another example, Code 39 is distinct from Code EAN 5.

Leaves—see definition for vine code. A null leaf is one that has no marking in the location for that leaf.

Pathogen-free—means the population of microbes, including but not limited to bacteria, viruses, prions and toxins, relevant to the experiment, are sufficiently reduced to meet the needs of the study, or to not impact the health, performance or behavior of the target animal population or of the workers.

Primary cage or home cage—the cage in which an animal spends more time than any other cage. Of note, there is a related term of art: "home cage." The definition of primary cage is, in some embodiments, the home cage. An aspect of home cage/primary cage deals with the fungibility of the actual cage itself. Each time a cage is changed, the physical cage is generally either disposed of or removed for washing, and replaced by a clean cage. The new physical cage is considered the same primary cage. A primary cage may sometimes be distinguished from a non-primary cage by the purpose of the cage. For example, a home cage may be for living in, as compared to an experimental cage to which the animal is transferred that is equipped or located for one or more particular experiments for the applicable study.

Sealed enclosure—an enclosure sealed against pathogens that impact or alter study results, or alter the credibility or repeatability of study results, entering or leaving the enclosure.

Sensor—may or may not include the use of local or remote processors, and may or may not include local or remote software executing on the local or remote processors. Sensors may or may not communicate over a network. Multiple sensors may or may not include common elements.

Spine—see definition for vine code.

Sterile—pathogen-free.

The primary cage is different from special purpose, behavioral-measurement, behavioral-detection, or behavioral-observation cages that are generally used for only a short time for the duration of a particular test due to cost and mindset.

Unique—occurs only once in the context or set defined to contain the element

Vine code—a code, generally machine readable, generally not commonly human-readable, comprising a series of line segments of varying lengths, or varying positions, or both. Typically the line segments are placed parallel to each other with a gap in between. An axis may be defined perpendicular to such parallel line segments. The line segments may have one end aligned with the axis or may, in some cases, cross or not cross the axis depending on the choice of the line segment. Data is encoded in the vine code by the variations in line length or position. Each line segment is called a leaf. The vine code may or may have starting or ending line segments, or both. Such starting or ending line segments may or may not encode data. Some leaves in some codes are missing. Generally, all line segments are equally spaced relative to the axis. The axis may or may not be printed or readable. A vine code may be marked in visible ink or may be marked using some other readable technology, including infrared, ultraviolet or magnet material. A vine code may be overlaid with another code such that they can be read independently. For example, a vine code may be printed in infrared ink while a human-readable code is printed overlaid in violet or blue ink. Filters may then be used to select one code over the other for reading. A human eye would not normally be able to see the infrared or ultraviolet ink.

Ideal, Ideally, Optimum and Preferred—Use of the words, "ideal," "ideally," "optimum," "optimum," "should" and "preferred," when used in the context of describing this invention, refer specifically a best mode for one or more embodiments for one or more applications of this invention. Such best modes are non-limiting, and may not be the best mode for all embodiments, applications, or implementation technologies, as one trained in the art will appreciate.

May, Could, Option, Mode, Alternative and Feature—Use of the words, "may," "could," "can," "option," "optional," "mode," "alternative," "typical," "ideal," and "feature," when used in the context of describing this invention, refer specifically to various embodiments of this invention. Described benefits refer only to those embodiments that provide that benefit. All descriptions herein are non-limiting, as one trained in the art appreciates.

What is claimed is:

1. A method of marking animals comprising the following steps:
   (a) choosing a first number pair comprising a first H number and a first M number;
   (b) placing the first number pair into a set of available number pairs;
   (c) choosing a next number pair comprising a next H number and a next M number;
   (d) computing an H distance between the next H number and at least a subset of all H numbers in the set of available number pairs;
   (e) computing an M distance between the next M number and at least a subset of all M numbers in the set of available number pairs;
   (f) comparing the H distance computed against an H distance threshold;
   (g) comparing the M distance computed against an M distance threshold;
   (h) discarding the next number pair if the H number is in a set of used H numbers;
   (i) discarding the next number pair if either the H distance is less than the H distance threshold or the M distance is less than the M distance threshold; otherwise adding the next number pair to the set of available numbers;
(j) repeating from step (c) until the size of the set of available number pairs is equal to or greater than a set size threshold;
(k) selecting a selected number pair from the set of available number pairs; the selected number pair comprising a selected H number and a selected M number;
(l) marking the selected H number using a human-readable encoding on a first animal;
(m) marking the selected M number using a machine-readable encoding on the first animal;
(n) placing the selected H number into the set of used H numbers;
wherein the human-readable encoding and the machine-readable encoding are distinct; and wherein the H number and the M number are distinct.

2. The method of marking animals in claim 1 comprising this additional step, following step (n):
(o) repeating from step (k) until a terminating condition is reached.

3. The method of marking animals in claim 1 wherein: the choosing in step (c) comprises choosing randomly.

4. The method of marking animals in claim 1 comprising the additional step:
(p) decreasing either the H distance threshold or the M distance threshold or both, responsive to the size of the set of available number pairs.

5. The method of marking animals in claim 1 wherein: the size of the subset in steps (d) and (e) is the smaller of: (i) the number of available number pairs in the set of available numbers; and (ii) a number in the range of 5 to 100.

6. The method of marking animals in claim 1 wherein: the output of the human-readable encoding of step (l) comprises one or more digits wherein each digit consists of a combination of seven line segments; and
the computing an H distance in step (d) comprises the sub-steps:
(d1) selecting a number pair, from the at least a subset of the set of available number pairs, comprising an H' and an M' number;
(d2) computing a Hamming distance between a first digit of the H number and a first digit of a H' number;
(d3) repeating step (d2) for each respective digit in the H number and H' number;
(d4) summing the Hamming distances from steps (d2) and (d3) to produce a Hamming sum;
(d5) repeating steps (d1) through (d4) for each number pair H' and M' in the at least a subset of the set of number pairs;
wherein a Hamming symbol set for the Hamming distance comprises the seven line segments;
wherein the H distance comprises the minimum of the Hamming sums.

7. The method of marking animals in claim 1 wherein: the output of the machine-readable marking encoding of step (m) comprises a vine code comprising two or more leaves wherein each leaf of the vine code consists of a combination of V line segments; and
the computing an M distance in step (e) comprises the sub-steps:
(e1) selecting a number pair, from the at least a subset of the set of available number pairs, comprising an H' and an M' number;
(e2) generating an output marking Mm from M using the machine readable marking encoding of above;
(e2) generating an output marking Mm' from M' using the machine readable marking encoding of above;
(e3) computing a Hamming distance between a first leaf of the Mm marking and a first leaf of the Mm' marking;
(e4) repeating step (e3) for each respective leaf in the Mm marking and the Mm' marking;
(e5) summing the Hamming distances from steps (e3) and (e4) to produce a Hamming sum;
(e6) repeating steps (e1) through (e5) for each number pair H' and M' in the at least a subset of the set of number pairs;
wherein a Hamming symbol set for the Hamming distance comprises the V line segments;
wherein the M distance comprises the minimum of the Hamming sums.

8. The method of marking animals in claim 1 wherein: the animals are rodents.

9. The method of marking animals in claim 1 wherein: the animals have no additional placed markings other than the markings placed by steps (l) and (m).

10. A device for marking animals in a vivarium using the method of claim 1 comprising:
a stored-program computer comprising software and memory adapted to execute the steps of claim 1 (a) through (k) and step (n);
a marking machine adapted to perform the steps of claim 1 (l) and (m).

11. A system for marking animals in a vivarium wherein; the vivarium comprises animals marked by the method of claim 1 using the device of claim 10.

12. A method of marking objects comprising the following steps:
(a) choosing a first number pair comprising a first H number and a first M number;
(b) placing the first number pair into a set of available number pairs;
(c) choosing a next number pair comprising a next H number and a next M number;
(d) computing an H distance between the next H number and at least a subset of all H numbers in the set of available number pairs;
(e) computing an M distance between the next M number and at least a subset of all M numbers in the set of available number pairs;
(f) comparing the H distance computed against an H distance threshold;
(g) comparing the M distance computed against an M distance threshold;
(h) discarding the next number pair if the H number is in a set of used H numbers;
(i) discarding the next number pair if either the H distance is less than the H distance threshold or the M distance is less than the M distance threshold; otherwise adding the next number pair to the set of available numbers;
(j) repeating from step (c) until the size of the set of available numbers is equal or greater than a set size threshold;
(k) selecting a selected number pair from the set of available numbers; the selected number pair comprising a selected H number and a selected M number;
(l) marking the selected H number using a human-readable encoding on a first object;
(m) marking the selected M number using a machine-readable encoding on the first object;
(n) placing the selected H number into the set of used H numbers;

wherein the human readable encoding and the machine-readable encoding are distinct.

* * * * *